United States Patent
King

(10) Patent No.: US 8,750,014 B2
(45) Date of Patent: *Jun. 10, 2014

(54) TRI-STATE DRIVER CIRCUITS HAVING AUTOMATIC HIGH-IMPEDANCE ENABLING

(75) Inventor: Greg King, Hastings, MN (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 13/467,676

(22) Filed: May 9, 2012

(65) Prior Publication Data

US 2012/0218008 A1 Aug. 30, 2012

Related U.S. Application Data

(63) Continuation of application No. 12/351,556, filed on Jan. 9, 2009, now Pat. No. 8,184,492.

(51) Int. Cl.
*H03K 3/00* (2006.01)
*G11C 7/10* (2006.01)

(52) U.S. Cl.
CPC ................... *G11C 7/1096* (2013.01)
USPC ...................... 365/108; 365/189.18

(58) Field of Classification Search
CPC ........................................................ H03K 3/00
See application file for complete search history.

(56) References Cited

U.S. PATENT DOCUMENTS

| | | | |
|---|---|---|---|
| 5,414,312 A | 5/1995 | Wong | |
| 6,731,134 B1 | 5/2004 | Bucossi et al. | |
| 6,996,027 B2 * | 2/2006 | Shin | 365/185.17 |
| 2002/0015338 A1 * | 2/2002 | Lee | 365/200 |
| 2006/0233234 A1 * | 10/2006 | Lim | 375/239 |
| 2007/0296463 A1 | 12/2007 | Illegems et al. | |
| 2008/0225608 A1 | 9/2008 | Lee et al. | |
| 2009/0141580 A1 | 6/2009 | Evans et al. | |
| 2010/0177578 A1 | 7/2010 | King | |

* cited by examiner

*Primary Examiner* — Huan Hoang
*Assistant Examiner* — James G Norman
(74) *Attorney, Agent, or Firm* — Dorsey & Whitney LLP

(57) ABSTRACT

Memories, driver circuits, and methods for generating an output signal in response to an input signal. One such driver circuit includes an input stage and an output stage. The input stage receives the input signal and provides a delayed input signal having a delay relative to the input signal. The output stage receives the delayed input signal and further receives the complement of the input signal. The output stage couples an output node to a first voltage in response to a complement of the input signal having a first logic level and couples the output to a second voltage in response to the complement of the input signal having a second logic level. The output stage further decouples the output from the first or second voltage in response to receiving the delayed input signal to provide a high-impedance at the output node.

18 Claims, 3 Drawing Sheets

TRI-STATE DRIVER CIRCUITS HAVING AUTOMATIC HIGH-IMPEDANCE ENABLING

CROSS REFERENCE TO RELATED APPLICATIONS

This application is a continuation of U.S. patent application Ser. No. 12/351,556, filed Jan. 9, 2009, and issued as U.S. Pat. No. 8,184,492, which application and patent are incorporated herein by reference, in their entirety, for any purpose.

TECHNICAL FIELD

Embodiments of the invention relate generally to integrated circuits, and more specifically, in one or more of the illustrated embodiments, to tri-state driver circuits.

BACKGROUND OF THE INVENTION

Driver circuits are common circuits used for transmission of signals, such as between integrated circuits ("ICs") or within an IC. For example, driver circuits can be used to transmit (1) data to and from a memory or (2) control signals to and from a memory controller. A driver circuit receives and input signal, such as a data signal, and drives an output signal having a logic level based on the input signal. There are many types of drivers, each with their own advantages and disadvantages.

Typically, a driver circuit can generate a HIGH logic-level output signal, a LOW logic level output signal, or can be placed in a high-impedance (high-Z) state. Driver circuits having the three states (i.e., HIGH, LOW, high-impedance) are generally referred to as tri-state driver circuits, and placing a driver circuit into a high-Z state is often referred to as "tri-stating" the driver circuit.

One example of a conventional driver circuit is one where the driver circuit is tri-stated by using a separate enable signal. For example, while the driver circuit outputs a HIGH logic-level signal or a LOW logic-level signal, the enable signal is inactive so that voltage/current can be driven to the output of the driver circuit. However, when the enable signal is active, the driver circuit is placed into a tri-state condition, and although a logic level can be maintained at the output of the driver circuit, a high-impedance is presented at the output and a current is generally no longer driven.

With conventional driver circuits that use a separate enable signal to control the high-impedance state of the driver circuit, the timing of the enable signal relative to the input and output signals should be closely controlled so that the driver circuit enters and exits the tri-state condition without interfering with the driving of an output signal having the correct logic-level responsive the input signal. In ICs using relatively high clock speeds (e.g., GHz magnitude clock speeds), providing such a correctly timed enable signal often requires additional circuitry that consume area of a substrate on which the IC is fabricated and consumes electrical power.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
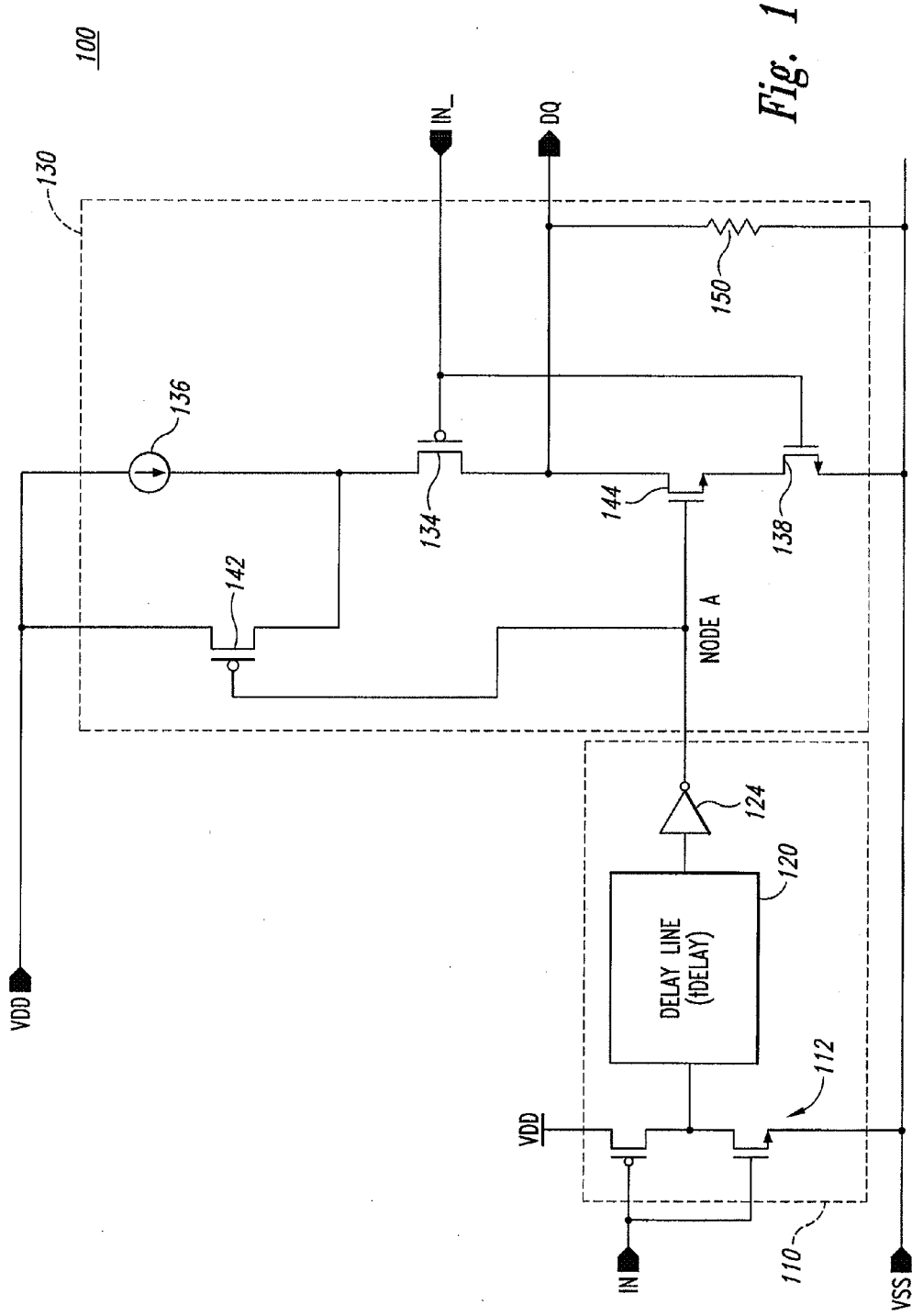
FIG. 1 is a schematic drawing of a signal driver circuit according to an embodiment of the invention.

FIG. 1 illustrates a signal driver circuit 100 according to an embodiment of the invention. The signal driver circuit 100 provides an output signal DQ in response to an input signal IN without the need for a separate enable signal. The signal driver circuit 100 includes an input stage 110 having an input circuit 112 coupled to receive the IN signal. In some embodiments of the invention, the input circuit 112 may be implemented as a complementary metal-oxide-semiconductor (CMOS) inverter. An output of the input circuit 110 is provided to delay line 120 where the output signal of the input circuit 112 is delayed by a delay tDelay before being provided to an inverter 124. In some embodiments, the delay line 120 includes delay stages, each delay stage adding incremental delay to provide the overall delay tDelay. In some embodiments, each delay stage is implemented by a capacitor coupled to the output of the input stage 110 through a switch. As known, increasing the capacitance coupled to a node, such as the output of the input circuit 112, generally results in slower response time at the node. In this manner, the tDelay time (i.e., the response time for a signal to transition from one logic level to another) can be modified by selectively coupling additional capacitance to the output of the input circuit 112, thereby increasing the tDelay time. In other embodiments, the delay line 120 includes delay stages coupled in series, each delay stage adding incremental delay. Other implementations of the delay line 120 may be used as well.

The output of the inverter 124 is coupled to a node A. The node A represents an input to an output stage 130. Coupled to node A are a boost circuit 142 and an enable circuit 144. In some embodiments, the boost circuit 142 may be implemented as a p-channel transistor and the enable circuit 144 may be implemented as a n-channel transistor. Activation of the boost and enable circuits 142, 144 are controlled by the output signal provided by the inverter 124. The output stage 130 further includes a pull-up circuit 134 and a pull-down circuit 138 for coupling an output node DQ to a voltage supply VDD and a reference (e.g., ground) to provide a HIGH and LOW logic level DQ signal, all respectively, in response to a complement of the input signal. The complementary input signal is shown in FIG. 1 as the IN_signal. As known, the IN_signal can be generated by applying the IN signal to an inverter circuit (not shown), which will output a complement signal in response. In some embodiments, the pull-up circuit 134 may be implemented as a p-channel transistor and the pull-down circuit 138 may be implemented as a n-channel transistor.

A current source 136 is coupled to provide a current through the pull-up circuit 134 for driving a HIGH logic level signal on the DQ node. In some embodiments, the current source 136 may be implemented by a current mirror circuit. A termination resistor 150 is coupled to the DQ node to maintain a logic level when the boost and enable circuits 142, 144 decouple the DQ node from the VDD supply and VSS through the pull-up and pull-down circuits 134, 138, all respectively.

The signal driver circuit 100 provides automatic tri-state control. That is, a separate enable signal to activate the signal driver circuit 100 in response to receiving an IN signal is unnecessary for operation. As will be described in more detail below, the signal driver circuit 100 utilizes a "true" input signal IN and its complement signal IN_to enable the signal driver circuit 100 in response to receiving an input signal to be driven onto the DQ node.

Figure 2:
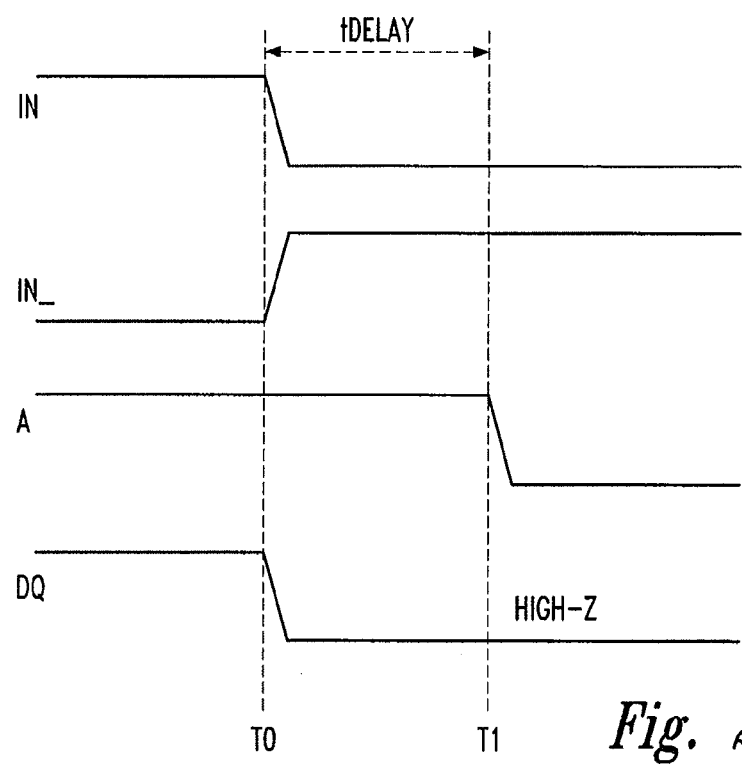
FIG. 2 is a timing diagram of various signals during operation according to an embodiment of the invention for a signal driver circuit.

Operation of the signal driver circuit 100 will be described with reference to the timing diagrams of FIGS. 2 and 3, as well as the block diagram of FIG. 1. With reference to FIGS. 1 and 2, in response to the signal driver circuit 100 receiving a IN signal transitioning from a HIGH logic level to a LOW logic level (the IN_signal transitioning from a LOW logic level to a HIGH logic level) (time T0), the HIGH logic level IN_signal deactivates the pull-up circuit 134 and activates the pull-down circuit 138. The previous HIGH logic level IN signal (prior to time T0), which results in a HIGH logic level signal output by the inverter 124, activated the enable circuit 144 at the time the transitioning IN signal is received at time T0. Thus, at the time the IN signal (as well as the IN_signal) is received at T0, activation of the pull-down circuit 138 by the HIGH logic level IN_signal at time T0 couples the DQ node to ground to provide a LOW logic level output signal DQ.

After the tDelay time of the delay line 120, the LOW level IN signal is provided to the input of the inverter 124 (as a HIGH logic level inverted by the input circuit 112 of the input stage 110) and is output at node A (as a LOW logic level signal) at time T1. The LOW logic level signal output by the inverter 124 deactivates the enable circuit 144. The DQ node is maintained at a LOW logic level, however, by termination resistor 150.

The LOW logic level signal at node A (time T1) also activates the boost circuit 142. However, due to the pull-up circuit 134 being deactivated (by the HIGH logic level IN_signal), activation of the boost circuit 142 does not affect the LOW logic level DQ signal output at the DQ node. As a result of deactivating the enable circuit 144 and having the pull-up circuit 134 deactivated, the DQ node can have a high-impedance condition (i.e., tri-state condition). In particular, the DQ node is not coupled to VDD (decoupled by the deactivated pull-up circuit 134) or to VSS (decoupled by the deactivated enable circuit 144). As previously described, however, a LOW logic level is maintained at the DQ node by the termination resistor 150.

Figure 3:
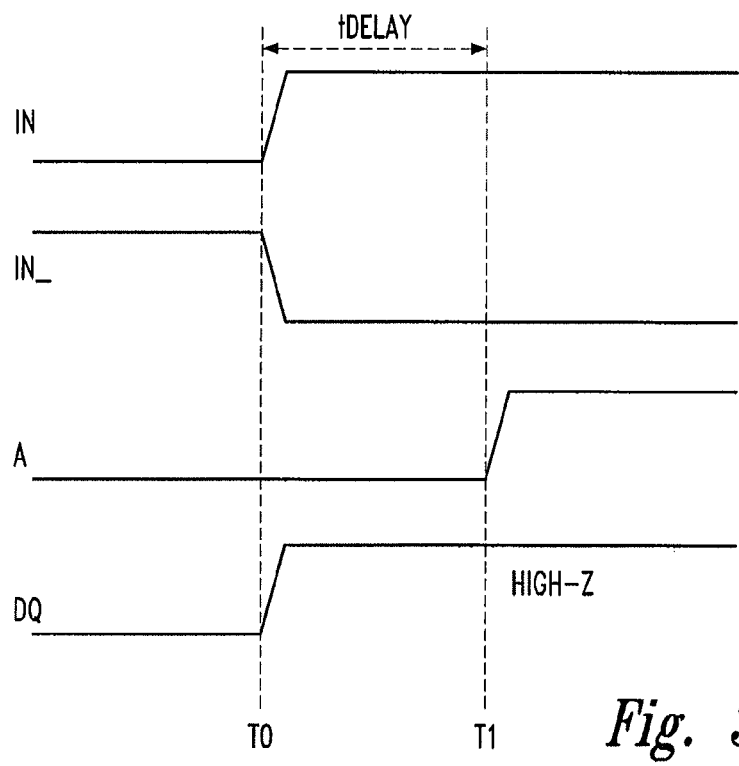
FIG. 3 is a timing diagram of various signals during operation according to an embodiment of the invention for a signal driver circuit.

With reference to FIGS. 1 and 3, in response to the signal driver circuit 100 receiving a IN signal transitioning from a LOW logic level to a HIGH logic level (the IN_signal transitioning from a HIGH logic level to a LOW logic level (time T0), the LOW logic level IN_signal deactivates the pull-down circuit 138 and activates the pull-up circuit 134. The previous LOW logic level IN signal (prior to time T0), which results in a LOW logic level signal output by the inverter 124, activated the boost circuit 142 at the time the transition IN signal is received at time T0. As a result, at the time the IN signal (as well as the IN_signal) is received at time T0, activation of the pull-up circuit 134 by the LOW logic level IN_signal at time T0 couples the DQ node to the VDD supply to provide a HIGH logic level DQ signal.

After the tDelay time of the delay line 120, the HIGH level IN signal is provided to the input of the inverter 124 (as a LOW logic level inverted by the input circuit 112 of the input stage 110) and is output at node A (as a HIGH logic level signal) at time T1. The HIGH logic level signal output by the inverter 124 deactivates the boost circuit 142. The DQ node is maintained at a HIGH logic level, however, by the current source 136 and the termination resistor 150.

The HIGH logic level signal at node A (time T1) also activates the enable circuit 144. However, due to the pull-down circuit 138 being deactivated (by the LOW logic level IN_signal), activation of the enable circuit 144 does not affect the HIGH logic level DQ signal output at the DQ node. As a result of deactivating the boost circuit 142 and having the pull-down circuit 138 deactivated, the DQ node can have a high-impedance condition (i.e., tri-state condition). In particular, the DQ node is not coupled to VDD (decoupled by the deactivated boost circuit 142) or to VSS (decoupled by the deactivated pull-down circuit 138). As previously described, however, a HIGH logic level is maintained at the DQ node by the current source 136 and the termination resistor 150.

A signal driver circuit according to some embodiments of the invention generates an output signal that is relative to ground, such as in signal driver circuit 100. A signal driver circuit according to some other embodiments of the invention generates an output signal that is relative to a power supply, such as VDD. In such embodiments, the circuitry of the signal driver circuit may be "flipped" relative to embodiments driving output signals relative to ground. For example, with reference to the signal driver circuit 100, in an embodiment driving an output signal relative to VDD, n-channel devices are replaced with p-channel devices and p-channel devices are replaced with n-channel devices, and the termination resistance is coupled between the DQ node and VDD. Such modifications are understood by those ordinarily skilled in the art, and a more detailed description of the modifications is omitted in the interest of brevity.

As illustrated by the previous examples, the signal driver circuit 100 does not require the use of an separate enable signal for operation. The IN and IN_signals are used to provide automatic tri-state control of the signal driver circuit. As a result, issues related to the provision of a enable signal that are coordinated with input data signals, such as the IN signal, is unnecessary. Moreover, eliminating the need to include circuitry for generating a separate enable signal, such as clock buffers and data flip-flop circuits, may reduce power consumption and needed area on the substrate that would have otherwise been required for the enable signal circuitry.

Additionally, the timing of the signal output by the inverter 124 and any transition of the IN and IN_signals is such that power consumption by the signal driver circuit 100 may be less than that compared to conventional signal driver circuits. In particular, current consumption due to overlap in activation (i.e., conductivity) of pull-up and pull-down circuits for conventional signal driver circuits can be reduced, and possibly avoided, in the signal driver circuit 100 because the boost and enable circuits 142, 144 can prevent current drainage to VSS when driving a DQ signal transitioning from a LOW logic level to a HIGH logic level. For example, with reference to FIGS. 1 and 3, and the previous description, the enable circuit 144 is deactivated prior to the pull-up circuit 134 being activated by the IN_signal transitioning from a HIGH to a LOW logic level. As previously discussed, the output from the inverter 124 resulting from the LOW logic level IN signal prior to the IN signal transitioning to a HIGH logic level (e.g., at time T0 in FIG. 3) deactivates the enable circuit 144. As the IN signal transitions from LOW to HIGH (and the IN_signal transitions from HIGH to LOW), the pull-up circuit 134 is activated. Although there is an overlap in the activation (i.e., conductivity) of the pull-down and pull-up circuits 134, 138, the deactivated enable circuit 144 can prevent or minimize the current that is drained to VSS. The current is instead applied to driving a HIGH logic level DQ signal at the DQ node. As a result, in comparison to conventional signal driver circuits, the signal driver circuit 100 may have lower power consumption.

Figure 4:
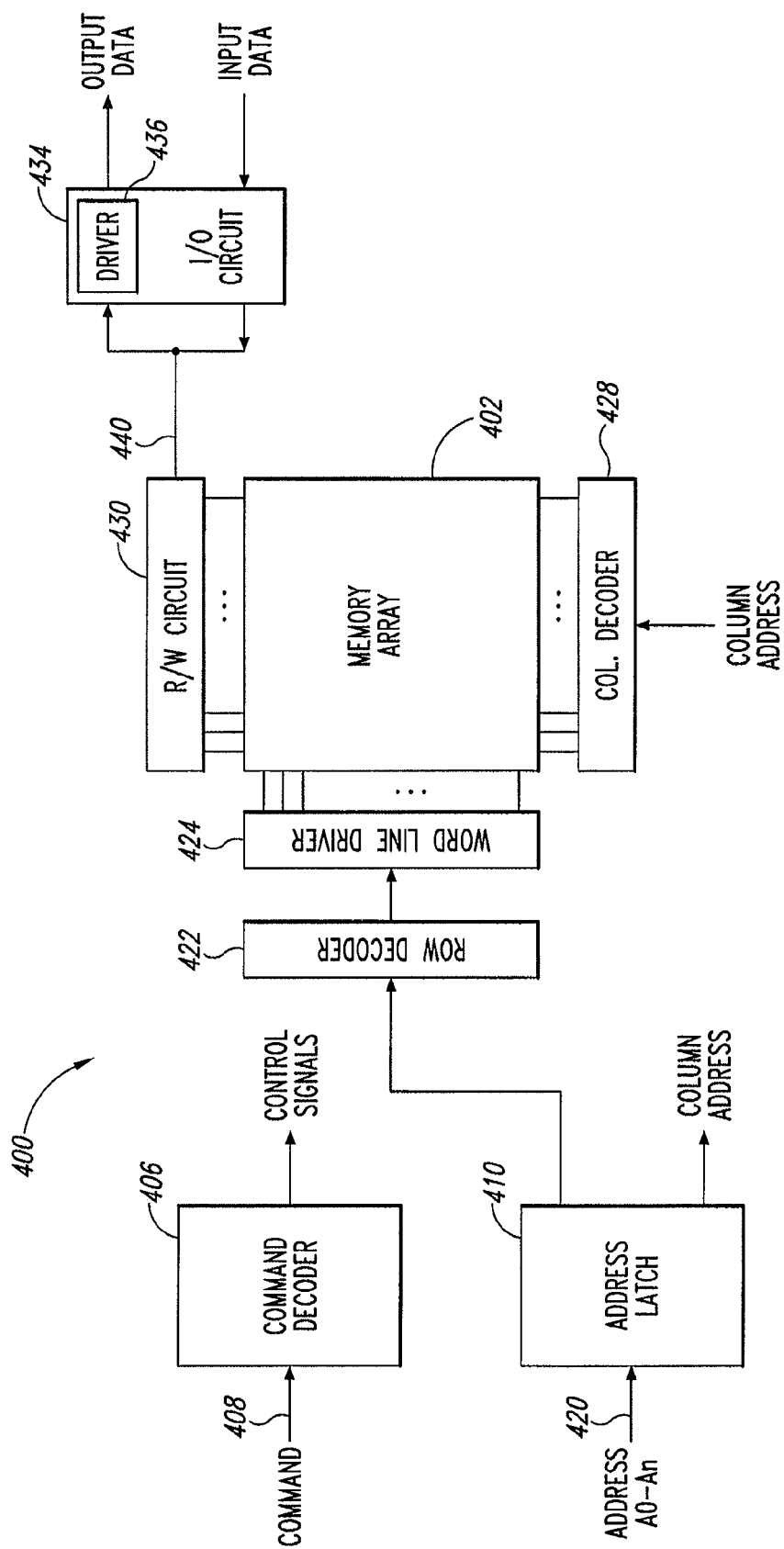
FIG. 4 is a block diagram of a memory according to an embodiment of the invention.

FIG. 4 illustrates a portion of a memory 400 according to an embodiment of the present invention. The memory 400 includes an array 402 of memory cells, which may be, for example, DRAM memory cells, SRAM memory cells, flash memory cells, or some other types of memory cells. The memory 400 includes a command decoder 406 that receives memory commands through a command bus 408 and generates corresponding control signals within the memory 400 to carry out various memory operations. The command decoder 406 responds to memory commands applied to the command bus 408 to perform various operations on the memory array 402. In particular, the command decoder 406 is used to generate internal control signals to read data from and write data to the memory array 402. Row and column address signals are applied to the memory 400 through an address bus 420 and provided to an address latch 410. The address latch then outputs a separate column address and a separate row address.

The row and column addresses are provided by the address latch 410 to a row address decoder 422 and a column address decoder 428, respectively. The column address decoder 428 selects bit lines extending through the array 402 corresponding to respective column addresses. The row address decoder 422 is connected to word line driver 424 that activates respective rows of memory cells in the array 402 corresponding to received row addresses. The selected data line (e.g., a bit line or bit lines) corresponding to a received column address are coupled to a read/write circuitry 430. Read data is provided by the read/write circuitry 430 to an I/O circuit 434 via an input-output data bus 440. The I/O circuit 434 includes a signal driver circuit 436 according to an embodiment of the invention. As previously described, the signal driver circuit 436 provides automatic tri-state control without the use a separate enable signal for operation. Write data are applied to the memory array 402 through the I/O circuit 434 and the memory array read/write circuitry 430.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A signal driver comprising:
an input stage configured to receive an input signal and configured to provide a delayed input signal having a delay relative to the input signal; and
an output stage coupled to the input stage to receive the delayed input signal and configured to receive a complement of the input signal, the output stage further configured to provide a first voltage at an output in response to the complement of the input signal transitioning from a first logic level to a second logic level and to provide a second voltage at the output in response to the complement of the input signal transitioning from the second logic level to the first logic level, the output stage further configured to place the output in a tri-state condition in response to receiving the delayed input signal and wherein the second voltage at the output is maintained by a current source responsive to the tri-state condition of the output;
wherein the output stage does not comprise a latch.

2. The signal driver of claim 1, wherein the output stage comprises:
a pull-up circuit configured to couple the output to a the first voltage responsive, at least in part, to the complement of the input signal having the first logic level; and
a pull-down circuit configured to couple the output to ground responsive, at least in part, to the complement of the input signal having the second logic level.

3. The signal driver of claim 1, wherein the pull-up circuit comprises a PMOS transistor and the pull-down circuit comprises an NMOS transistor, wherein the PMOS and NMOS transistors are configured to receive the complement of the input signal at their respective gates.

4. The signal driver of claim 1, wherein the input stage comprises:
an input circuit configured to provide an output signal based, at least in part, on an input signal; and
a delay line coupled to the input circuit and configured to provide the delayed input signal based, at least in part, on the output signal, wherein the delayed input signal has a delay relative to the output signal.

5. The signal driver of claim 4, wherein the delay line comprises a plurality of delay stages, wherein each of the delay stages comprises a switch and a capacitor, each switch configured to selectively couple the respective capacitor to an input of the delay line.

6. The signal driver of claim 1, wherein the output stage comprises a resistance coupled to the output.

7. A signal driver circuit, comprising:
an input stage configured to receive an input signal and provide a delayed input signal having a delay relative to the input signal; and
an output stage coupled to the input stage and configured to receive the delayed input signal and a complement of the input signal, the output stage further configured to couple an output to a first voltage responsive to the complement of the input signal transitioning from a first logic level to a second logic level and to couple the output to a second voltage in response to the complement of the input signal transitioning from the second logic level to the first logic level, the output stage further configured to decouple the output from the first or second voltage in response to receiving the delayed input signal,
wherein the output stage comprises first and second transistors configured to receive the complement of the input signal, the first transistor configured to be enabled responsive to the complement of the input signal having a first state and the second transistor configured to be enabled responsive to the complement of the input signal having a second state; and
wherein the output stage is configured to couple the output to the first and second voltages simultaneously.

8. The signal driver of claim 7, wherein the output stage comprises a current source coupled to the output and is further configured to provide current to the output at least while the output is decoupled from the first voltage.

9. The signal driver circuit of claim 7, wherein the output stage further comprises a termination resistor, wherein the current source is configured to be coupled to the termination resistor at least while the output is decoupled from the first voltage.

10. The signal driver circuit of claim 7, wherein the delay is based, at least in part, on a capacitance.

11. The signal driver circuit of claim 7, wherein the output stage is configured to couple the output to the first voltage using the first transistor and couple the output to the second voltage using the second transistor.

12. A method for generating an output signal in response to an input signal, the method comprising:
    delaying an input signal;
    providing a first voltage at an output responsive to a complementary input signal transitioning from a first logic level to a second logic level;
    providing a second voltage at the output responsive to the complementary input signal transitioning from the second logic level to the first logic level;
    placing the output in a tri-state condition responsive to receipt of the delayed input signal; and
    after placing the output in a tri-state condition, maintaining the second voltage at the output using a termination resistance.

13. The method of claim 12, wherein said maintaining the logic level comprises:
    coupling a current source to a resistor.

14. The method of claim 12, wherein said placing the output in a tri-state condition comprises:
    decoupling the output from a reference voltage.

15. The method of claim 12, wherein said delaying an input signal, comprises:
    selectively coupling a plurality of capacitances to an input of an inverter.

16. The method of claim 12, wherein the input signal is delayed using a plurality of delay stages of a delay line.

17. The method of claim 12, where said providing a voltage at an output comprises:
    coupling the output to a reference voltage through a pair of switches responsive to receipt of the complementary input signal.

18. The method of claim 17, wherein the pair of switches comprises a PMOS transistor and/or an NMOS transistor.

* * * * *

UNITED STATES PATENT AND TRADEMARK OFFICE
CERTIFICATE OF CORRECTION

| | |
|---|---|
| PATENT NO. | : 8,750,014 B2 |
| APPLICATION NO. | : 13/467676 |
| DATED | : June 10, 2014 |
| INVENTOR(S) | : Greg King |

It is certified that error appears in the above-identified patent and that said Letters Patent is hereby corrected as shown below:

In the Claims:

In column 6, line 3, in Claim 2, delete "to a the" and insert -- to the --, therefor.

Signed and Sealed this
Twenty-sixth Day of August, 2014

Michelle K. Lee
*Deputy Director of the United States Patent and Trademark Office*